(12) United States Patent
Pol et al.

(10) Patent No.: US 8,502,324 B2
(45) Date of Patent: Aug. 6, 2013

(54) SEMICONDUCTOR WAFER HAVING SCRIBE LANE ALIGNMENT MARKS FOR REDUCING CRACK PROPAGATION

(75) Inventors: Victor Pol, Austin, TX (US); Chong-Cheng Fu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 301 days.

(21) Appl. No.: 12/581,549

(22) Filed: Oct. 19, 2009

(65) Prior Publication Data

US 2011/0089581 A1 Apr. 21, 2011

(51) Int. Cl.
  *H01L 29/76* (2006.01)
  *H01L 29/94* (2006.01)
  *H01L 31/062* (2006.01)
  *H01L 31/113* (2006.01)
  *H01L 31/119* (2006.01)

(52) U.S. Cl.
  USPC ............... 257/401; 257/462; 257/E23.179

(58) Field of Classification Search
  USPC ............ 257/797, E23.179; 438/401, 462, 438/460
  See application file for complete search history.

(56) References Cited

U.S. PATENT DOCUMENTS

| | | | |
|---|---|---|---|
| 4,981,529 A | 1/1991 | Tsujita | |
| 5,525,840 A | 6/1996 | Tominaga | |
| 5,700,732 A * | 12/1997 | Jost et al. | 438/401 |
| 5,757,507 A * | 5/1998 | Ausschnitt et al. | 356/401 |
| 6,137,578 A * | 10/2000 | Ausschnitt | 356/399 |
| 6,259,164 B1 | 7/2001 | Batterson et al. | |
| 7,096,127 B2 * | 8/2006 | Ziger et al. | 702/32 |
| 7,102,749 B2 * | 9/2006 | Bareket | 356/401 |
| 7,163,883 B2 | 1/2007 | Agarwala et al. | |
| 7,180,593 B2 * | 2/2007 | Lin | 356/401 |
| 7,687,925 B2 * | 3/2010 | Marokkey et al. | 257/797 |
| 2002/0094679 A1 | 7/2002 | Song et al. | |
| 2008/0142997 A1 * | 6/2008 | Kuo et al. | 257/797 |
| 2008/0164468 A1 * | 7/2008 | Chen et al. | 257/48 |
| 2009/0148796 A1 | 6/2009 | Van Der Heijden et al. | |
| 2009/0176167 A1 | 7/2009 | Hulsebos et al. | |

FOREIGN PATENT DOCUMENTS

| | | |
|---|---|---|
| EP | 12609870 A1 | 11/2002 |
| KR | 1020030041015 A | 5/2003 |

OTHER PUBLICATIONS

PCT Application No. PCT/US2010/049636; Search Report and Written Opinion dated Apr. 26, 2011.

Hinnen, Paul et al.; "Flexible Alignment Mark Design Applications using a Next Generation Phase Grafting Alignment System"; Proceedings of SPIE; 2005; May 10, 2005pp 363-374; vol. 5752.

Warrick, Scott et al.; "Alignment Robustness for 90 nm and 65 nm node Through Copper Alignment Mark Integretation Optimization"; SPIE Optical Microlithograpy; May 12, 2004; 15 pgs; vol. 5754.

* cited by examiner

*Primary Examiner* — Hoai V Pham
(74) *Attorney, Agent, or Firm* — James L. Clingan, Jr.

(57) ABSTRACT

A wafer including at least a first die and at least a second die, wherein the first die and the second die are separated from each other by an area located between the first die and the second die, is provided. The wafer further includes an alignment mark group used for aligning the wafer to a tool used for patterning the wafer. The alignment mark group is located entirely within the area between the first die and the second die and the alignment mark group includes a plurality of alignment lines, and wherein each line of the plurality of alignment lines is formed using a plurality of segments separated from each other by a plurality of gaps filled with an insulating material.

18 Claims, 5 Drawing Sheets

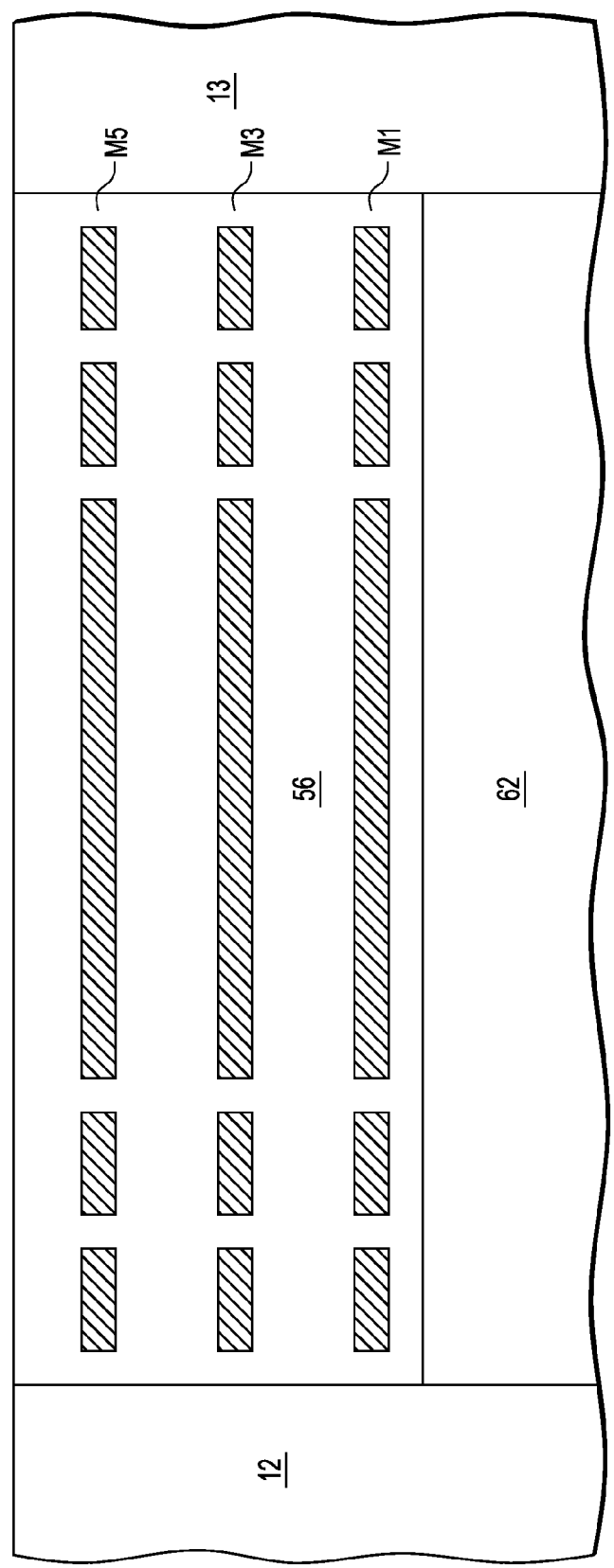

SEMICONDUCTOR WAFER HAVING SCRIBE LANE ALIGNMENT MARKS FOR REDUCING CRACK PROPAGATION

BACKGROUND

1. Field

This disclosure relates generally to semiconductors, and more specifically, to a semiconductor wafer structure.

2. Related Art

Alignment marks are commonly used in the manufacture of semiconductor devices. In order to accurately position semiconductor devices in an array of rows and columns of semiconductor die formed on a wafer, alignment marks on the wafer are used by equipment. Such alignment marks are typically positioned in the areas between the semiconductor die which are commonly referred to as scribe lanes. The semiconductor die are singulated by being sawed or cut to form a kerf. The alignment marks are typically the largest structures in the scribe lane. Conventional dicing saws typically have a cutting width on the order of forty microns or less. However, current alignment marks remain large in size relative to the kerf due to limitations of alignment systems on conventional lithography equipment. As a result, damage may occur to semiconductor die adjacent each scribe lane when narrow dimensioned kerfs are implemented and a saw encounters a large alignment mark.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 5 illustrates in cross-sectional form an example of a complementary stacked embodiment of the scribe lane alignment mark of FIG. 3.

DETAILED DESCRIPTION

Figure 1:
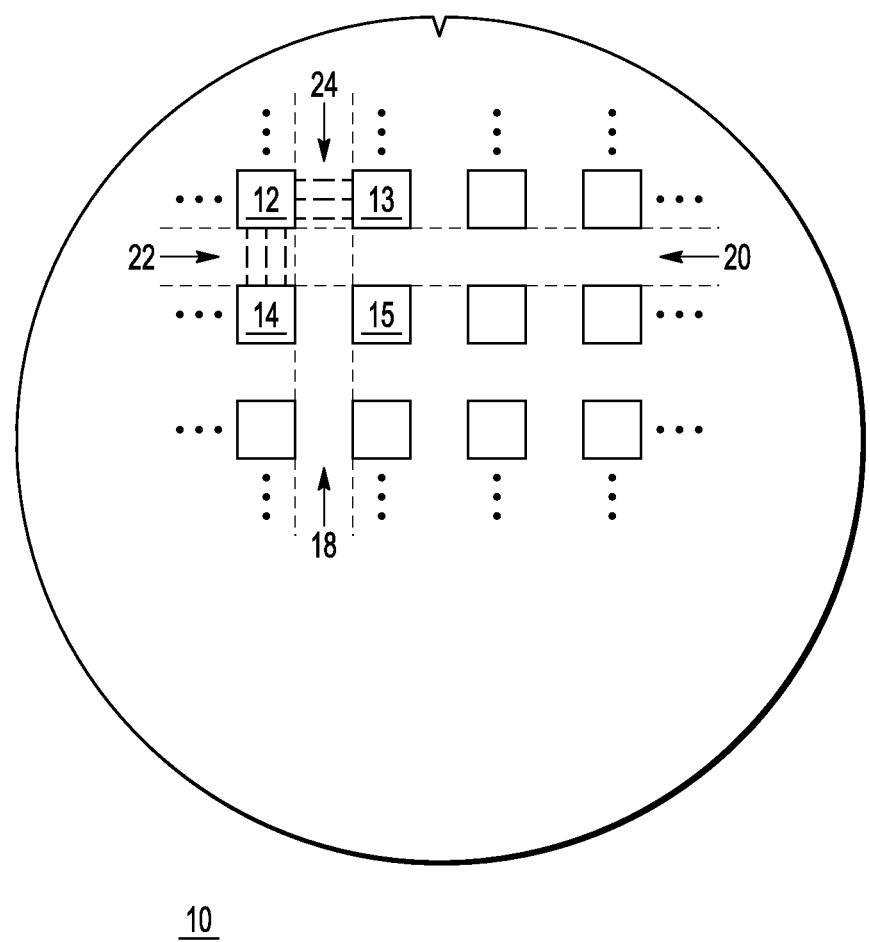
FIG. 1 illustrates in perspective form a semiconductor wafer having scribe lane alignment marks in accordance with the present invention.

Illustrated in FIG. 1 is a semiconductor wafer 10 having a plurality of semiconductor die such as die 12, die 13, die 14 and die 15. All die on the wafer are electrically isolated by dielectric material (i.e. insulating material). Any of a variety of dielectric materials may be used. The semiconductor die which are implemented within wafer 10 are typically arranged in an array having rows and columns of die. As indicated by the multiple dots, only a small number of the many semiconductor die that are implemented within the wafer 10 are illustrated. The array of rows and columns of die result in a plurality of horizontal and vertical scribe lanes which separate or divide the die. For example a vertical scribe lane 18 is formed and a horizontal scribe lane 20 is formed. It should be understood that for purposes of illustration the sizes of the die and scribe lanes are not accurate in FIG. 1 as the scribe lanes are much smaller in dimension than the semiconductor die in practice. Also, any type of semiconductor die may be implemented within the wafer 10 so the actual size of the semiconductor die will vary between wafers depending upon what product is being formed. Within some scribe lanes adjacent to some of the die are formed scribe lane marks in accordance with the present invention. For example, within scribe lane 18 is a scribe lane alignment mark 24, and within scribe lane 20 is a scribe lane mark 22. As will be illustrated in greater detail in FIG. 2, each scribe lane mark has a plurality of lines of a first material which are segmented and separated by a second material. The first material and the second material may be either conductive or non-conductive. In one form, the first material is a conductive material, such as copper or another metal to form a conductive line. In such a form the second material is a dielectric for electrical insulation. The conductive lines in each scribe lane alignment mark are, in one form, implemented orthogonal or perpendicular to the direction in which the wafer will be cut. Other angular positions however may be used. When the adjacent conductive lines of each alignment mark within a scribe lane are perpendicular to the direction in which the saw is cutting the scribe lane, an efficient use of scribe lane area is achieved. In other words, a significant number of conductive lines to permit optical equipment to easily locate the alignment mark may be implemented even though the scribe lane is narrow. If the conductive lines are implemented parallel to the edge of a die rather than perpendicular to it, a larger width for the scribe lane is required in order to permit the optical equipment to locate the alignment mark.

Figure 2:
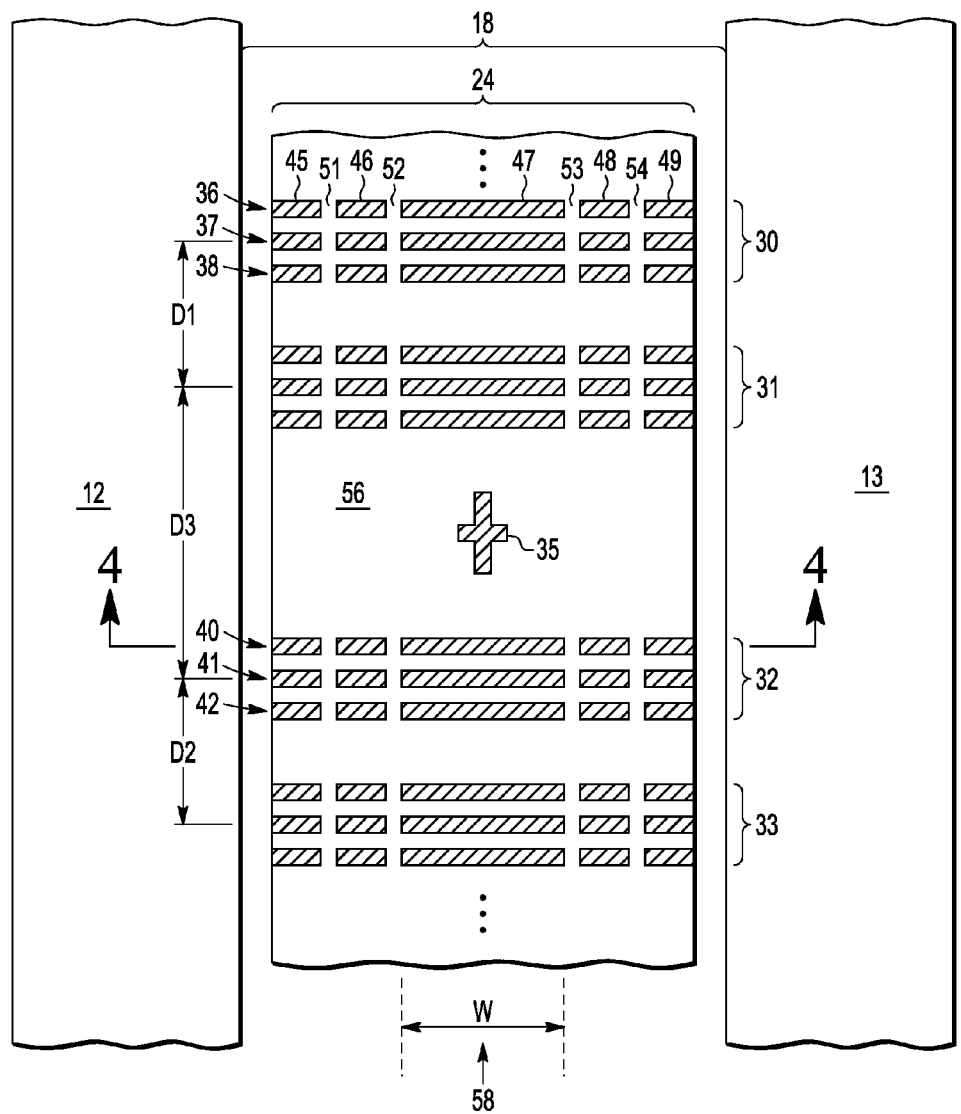
FIG. 2 illustrates in perspective form one embodiment of a scribe lane alignment mark in accordance with the present invention.

Illustrated in FIG. 2 is a further detail of a first form of the scribe lane 18 of FIG. 1 in the area between die 12 and die 13. As mentioned above, within the scribe lane 18 is a scribe lane alignment mark 24. The scribe lane alignment mark 24 has a plurality of alignment mark groups such as group 30, group 31, group 32 and group 33. Each alignment mark group has one or more conductive lines which are orthogonal to the direction in which the scribe lane 18 will be sawed. A central reference mark 35 is positioned between groups 30 and 31 and groups 32 and 33 and is a nominal alignment center. The groups above the central reference mark 35 are typically different in number of the groups from those below the central reference mark 35. In the illustrated form, each of groups 30-33 is implemented with three scribe lane mark lines. It should be understood that other numbers of scribe lane mark lines or a single scribe lane mark line may be implemented. It should also be understood that other distances between the scribe lane mark lines in the groups 30-33 may be implemented as a specific implementation is shown for purposes of explanation only. A distance between a central scribe lane mark line of the group 30 and a central scribe lane mark line of the adjacent group 31 is identified as distance D1. Similarly, a distance between a central scribe lane mark line of the group 32 and a central scribe lane mark line of the adjacent group 33 is identified as distance D2. A distance between the central scribe lane mark line of group 31 and the central scribe lane mark line of the group 32 is identified as distance D3. For a specific alignment detection hardware, each lithography equipment manufacturer specifies certain separation distances between groups. Therefore, depending upon the detection hardware, distances D1, D2 and D3 are subject to variation in accordance with what equipment is being used. In one form the distance D2 is greater in value than distance D1. Thus it can be readily understood that the size of an alignment mark in the direction of a kerf from a saw is lithography equipment dependent. As a result, various scribe lane mark line groupings and separations may be implemented.

Within group 30 is provided scribe lane mark lines 36, 37 and 38, and within group 32 are scribe lane mark lines 40, 41 and 42. In the illustrated form of this example, the scribe lane mark lines of group 31 are the same as in group 30. Similarly, the scribe lane mark lines of group 32 are the same as in group 33. Above group 30 is provided a plurality of additional similar groups. Below group 33 is also provided a plurality of additional similar groups. In one form only, a total of nineteen identical groups are provided above the central reference mark 35 and a total of twenty-one identical groups are provided below the central reference mark 35. Each of the scribe lane mark lines is segmented and is formed having a plurality of segments which are separated by gaps. For example, within the scribe lane mark line 36 are line segments 45, 46, 47, 48 and 49. Segments 45 and 46 are separated by a gap 51. Segments 46 and 47 are separated by a gap 52. Segments 47 and 48 are separated by a gap 53. Segments 48 and 49 are separated by a gap 54. The gaps 51-54 are formed of a dielectric 56 if the scribe lane mark lines are formed of a conductive material, such as copper. In a more general sense, the scribe lane mark lines and gap material only need to be differing materials, whether conductive or not.

A kerf 58 having a width W is cut through a central portion of the scribe lane 18. The kerf is formed using a saw. If the scribe lane mark lines are formed of a conductive material such as copper and are continuous, the rotating action of the saw's blade will rip through the copper and violently lift it up in a lateral action. The lifting of the copper extends laterally and causes cracking which can extend into the gap or buffer zone between the scribe lane alignment mark 24 and each of the die 12 and die 13. In many instances the cracking will extend through the buffer zone and into one or both of the adjacent die 12 and die 13 and thereby destroy the functionality of circuitry at the periphery of the die 12 and die 13. In other instances the cracking will result in premature failure of the semiconductor die after the die has been implemented in an end use application. Die crack stops may be implemented at the periphery of each of die 12 and die 13 but this solution is typically not totally effective. In order to alleviate the die cracking problem, each of the scribe lane mark lines is segmented to stop the lateral propagation of a crack caused by the sawing action. The scribe lane mark lines are implemented as rectangular lines which have a plurality of rectangular sections separated by gaps. The interrupted or divided scribe lane mark lines extend across a width of the scribe lane alignment mark 24. In one form, the gaps of all the adjacent scribe lane mark lines align in the direction of the sawing and the material of the various segments of the adjacent scribe lane mark lines also align. In other forms the gaps of the adjacent scribe lane mark lines do not have to align in the direction of the sawing.

The segmented scribe lane mark lines are rectangular in shape and have a length which is long enough so that no significant reduction in the amount of mark line material occurs. As a result, the optical characteristics for the optical recognition equipment that is used are not significantly degraded. In other words, the gaps that are implemented between the various segments are relatively small enough so as to not significantly reduce the ability of the optical recognition equipment to align the semiconductor wafer. By making the segmented scribe lane mark lines of continuous-material in rectangular patterns, no loss of reflecting or absorbing material is incurred other than in the gaps or spaces between the segments.

Figure 3:
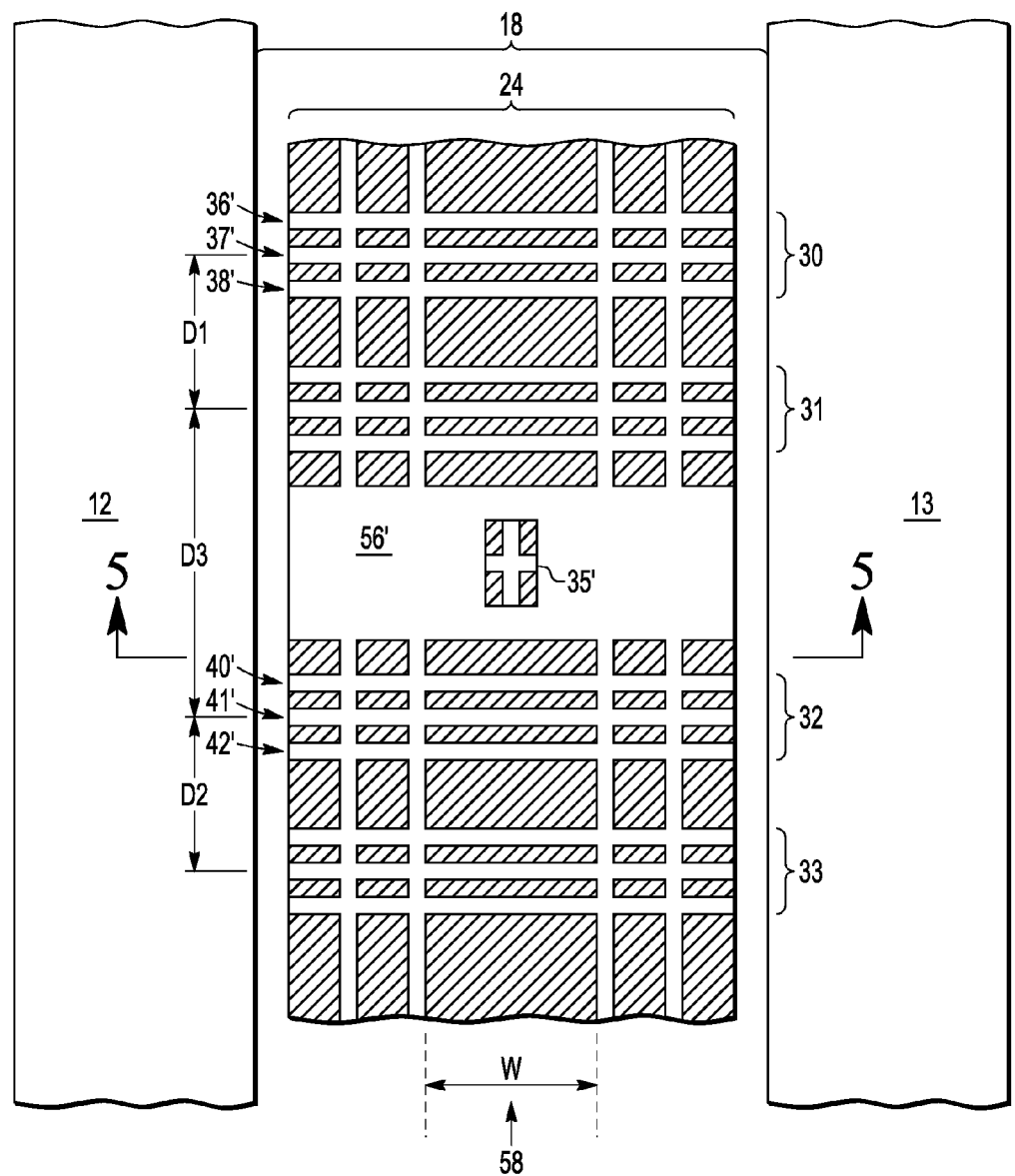
FIG. 3 illustrates in perspective form another embodiment of a scribe lane alignment mark in accordance with the present invention which may be used separately or in a stacked interdigitated combination with the alignment mark of FIG. 2.

Illustrated in FIG. 3 is another embodiment of a scribe lane alignment mark 24' in accordance with the present invention which may be used separately or in a stacked combination with the alignment mark of FIG. 2. In the illustrated form it is assumed that scribe lane alignment mark 24' will be stacked with scribe lane alignment mark 24 of FIG. 2. Therefore, for ease of understanding and convenience of illustration, common elements between FIG. 3 and FIG. 2 will be identically numbered. Each of the scribe lane mark lines 36, 37 and 38 are formed of dielectric material surrounded by metal, assuming that the scribe lane alignment mark 24' is implemented with metal and dielectric material. Therefore, in this form the scribe lane alignment mark 24' is complementary in material formation to the scribe lane alignment mark 24 of FIG. 2. Similarly, the central reference mark 35' is formed of metal and dielectric material that is reciprocal or opposite to that of the central reference mark 35 of FIG. 2. The central reference mark 35' is surrounded by dielectric 56' which, unlike the FIG. 2 implementation, does not extend into group 31 and group 32. In the illustrated form, the scribe lane alignment mark 24' may be aligned either above or below the scribe lane alignment mark 24 of FIG. 2 and is implemented in differing metallization layers. However, the scribe lane alignment mark 24' may also be implemented separately as illustrated without additional metallization layers in the scribe lane.

Figure 4:
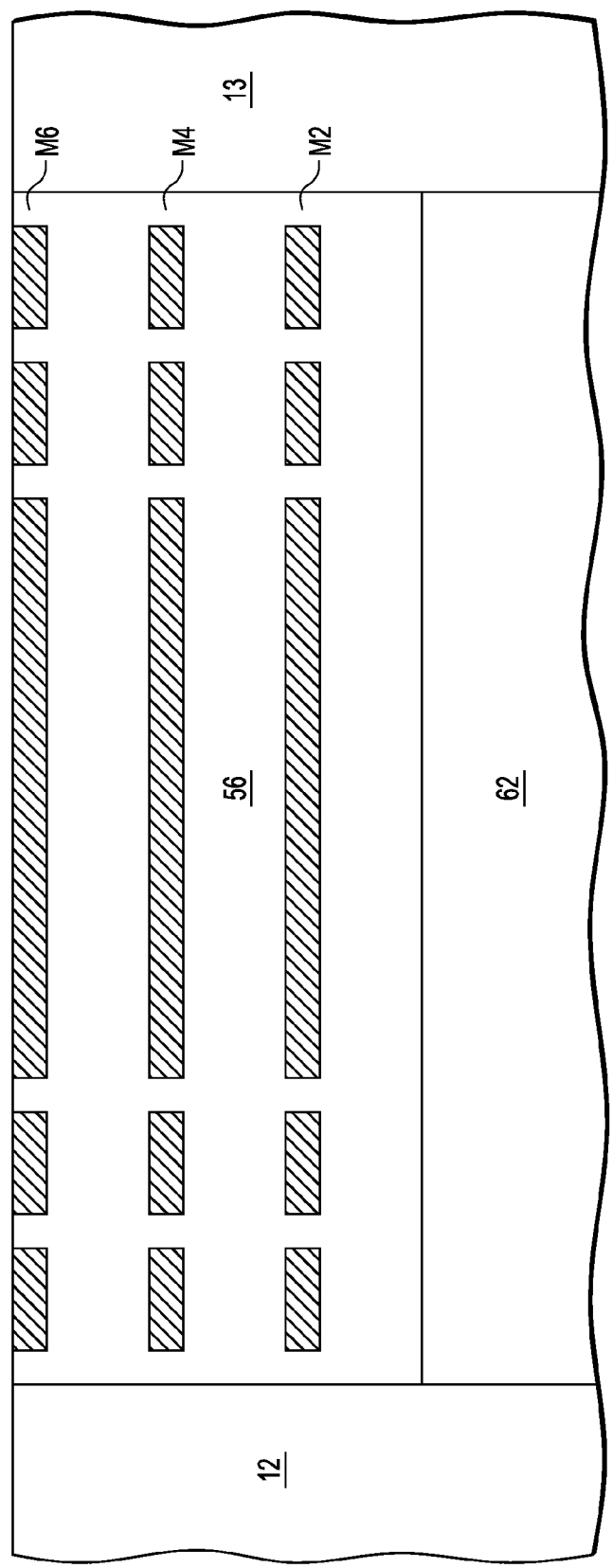
FIG. 4 illustrates in cross-sectional form an example of a stacked embodiment of the scribe lane alignment mark of FIG. 2.

Illustrated in FIG. 4 is a cross-section of the metallization layers within the metalized scribe lane mark line 40 of FIG. 2 along line 4-4. A substrate 62 is provided in the scribe lane 18 and is adjoined on either side by die 12 and die 13. Overlying the substrate 62 is the dielectric 56. The scribe lane alignment mark 24 of FIG. 2 is implemented with scribe lane mark lines in every other metallization layer; for example, a second metallization layer (M2), a fourth metallization layer (M4) and a sixth metallization layer (M6). The metal of each layer is aligned as well as the gaps. Separating the M2, M4 and M6 layers and forming the gaps of each metallization layer is the dielectric 56. It should be appreciated that the metallization illustrated in FIG. 4 may be implemented by either the formation of individual patterned metal layers and dielectric layers or by the formation of individual via layers in which alternating layers of metal and dielectric are formed.

Illustrated in FIG. 5 is a cross-section of the metallization layers within the adjoining metal to the dielectric scribe lane mark line 40' along line 5-5 of FIG. 3 when the FIG. 3 scribe lane alignment mark is used in a stacked and interdigitated combination with the scribe lane alignment mark of FIG. 2. As a result of the stacked and interdigitated combination, the top exposed metal of FIG. 3 is no longer a top layer of metal but rather is represented as metal layer M5 of FIG. 5. In other words, the scribe lane mark lines of FIG. 5 illustrate the odd metal layers, beginning with a metal layer 1, and the scribe lane mark lines of FIG. 4 illustrate the even metal layers, beginning with a metal layer 2.

Above the substrate 62 is the dielectric 56 as described in connection with FIG. 4. The adjoining metal to the dielectric scribe lane mark line 41' is implemented with a first metallization layer (M1), a third metallization layer (M3) and a fifth metallization layer (M5), for example. The metal of each layer is aligned as well as the gaps. In the direction perpendicular to the saw cut, the metal and gaps of each metallization layer of FIG. 4 and FIG. 5 are aligned. It should be appreciated that the gaps do not need to align in the direction perpendicular to the saw cut. In the direction aligned to the saw cut, the metal and gaps of each metallization layer of FIG. 4 and FIG. 5 are complementary between implementing metal and implementing a dielectric for an embodiment where FIG. 2 and FIG. 3 are overlapping (either one may be over the other). In an embodiment where FIG. 2 is implemented without overlapping or underlapping FIG. 3 or vice versa, the layers of FIG. 4 and FIG. 5 may be formed such that they are not interdigitated and do not overlap.

It should also be appreciated that the metallization illustrated in FIG. 5 may be implemented by either the formation of individual patterned metal layers and dielectric layers or by the formation of individual via layers in which alternating layers of metal and dielectric are formed.

By now it should be appreciated that there has been provided a semiconductor wafer having die arranged in an array to form scribe lanes in which alignment marks have segmented parallel lines which are perpendicular to a direction in which the wafer is cut to form singulated die. Each segment is separated from another segment by a gap. When a kerf is formed along approximately a center of a scribe lane, the saw which is forming the kerf will lift the alignment mark when the blade of the saw hits the alignment mark. The lifting of the alignment mark material pulls the alignment mark in various directions. Without the gaps isolating multiple separate portions of the alignment mark, a crack would likely propagate through the entire alignment mark laterally and to the edge of the adjoining die. As a result of this cracking, the side of the die is typically physically modified which will cause failure of the die. Usually the force of the cracking is significant enough that even the presence of a crack stop around the periphery of the die does not ensure that the cracking will not harm the die. A common material used for the alignment mark is copper and the copper is easily lifted from the saw blade action. The segmentation of the alignment marks that are perpendicular to the saw direction reduces the amount of copper lifting as well as reducing the amount of required copper. Additionally, the alignment marks are formed as groups of segmented parallel lines where the center of each set of groups is separated by a predetermined distance. Groups above or to the left of a centered mark are separated by a different distance than groups below or to the right of the centered mark. Also, a different number of groups are implemented in one direction from the centered mark than in an opposite direction from the centered mark. Therefore, the robustness of the alignment marks is maintained while reducing cracking of adjacent die when the die are singulated or when kerfs are formed.

There is provided in one form a wafer having at least a first die and at least a second die. The first die and the second die are separated from each other by an area located between the first die and the second die. A first alignment mark group is used for aligning the wafer to a tool used for patterning the wafer. The first alignment mark group is located entirely within the area between the first die and the second die. The first alignment mark group includes a first plurality of alignment lines. Each line of the first plurality of alignment lines is formed using a first plurality of segments separated from each other by a first plurality of gaps filled with an insulating material. In another form at least a second alignment mark group is used for aligning the wafer to a tool used for patterning the wafer. The second alignment mark group is located entirely within the area between the first die and the second die. The second alignment mark group includes a second plurality of alignment lines. Each line of the second plurality of alignment lines is formed using a second plurality of segments separated from each other by a second plurality of gaps filled with an insulating material. In another form the first plurality of segments is formed either in a first plurality of metal layers of the wafer or in a first plurality of via layers of the wafer. The second plurality of segments is formed either in a second plurality of metal layers of the wafer or in a second plurality of via layers of the wafer. In another form a length of each of the first plurality of segments is at least three times greater than a length of each of the first plurality of gaps filled with the insulating material. In another form at least a third alignment mark group is used for aligning the wafer to a tool used for patterning the wafer. The third alignment mark group is located entirely within the area between first die and the second die, wherein the third alignment mark group includes a third plurality of alignment lines, and wherein each line of the third plurality of alignment lines is formed using a third plurality of segments separated from each other by a third plurality of gaps filled with an insulating material. In another form there is provided a fourth alignment mark group used for aligning the wafer to the tool used for patterning the wafer. The fourth alignment mark group is located entirely within the area between first die and the second die, wherein the fourth alignment mark group includes a fourth plurality of alignment lines, and wherein each line of the fourth plurality of alignment lines is formed using a fourth plurality of segments separated from each other by a fourth plurality of gaps filled with an insulating material. In another form a central axis that is parallel to the first plurality of lines of the first alignment group and a central axis that is parallel to the third plurality of lines of the third alignment group are separated by a first distance. A central axis that is parallel to the second plurality of lines of the second alignment mark group and a central axis that is parallel to the fourth plurality of lines of the fourth alignment mark group are separated by a second distance. The second distance is greater than the first distance. In another form the first plurality of segments are formed using a conductive material containing at least copper.

In another form there is herein provided a wafer having at least a first die and at least a second die. The first die and the second die are separated from each other by an area located between the first die and the second die. A first alignment mark is provided for aligning the wafer to a tool used for patterning the wafer. The first alignment mark is located entirely within the area between the first die and the second die. The first alignment mark includes a central reference mark and a first alignment line and a second alignment line located on opposite sides of the central reference mark. The first alignment line is formed using a first plurality of segments separated from each other by a first plurality of gaps filled with an insulating material, and the second alignment line is formed using a second plurality of segments separated from each other by a second plurality of gaps filled with the insulating material. In another form the first plurality of segments is formed either in a first plurality of metal layers of the wafer or in a first plurality of via layers of the wafer. The second plurality of segments is either formed in a second plurality of metal layers of the wafer or in a second plurality of via layers of the wafer. In another form a length of each of the first plurality of segments is at least three times greater than a length of each of the first plurality of gaps filled with the insulating material and wherein a length of each of the second plurality of segments is at least three times greater than a length of each of the second plurality of gaps filled with the insulating material. In yet another form the first plurality of segments are formed using a conductive material containing at least copper.

In another form there is provided a wafer having at least a first die and at least a second die. The first die and the second die are separated from each other by an area located between the first die and the second die. A first alignment mark group is used for aligning the wafer to a tool used for patterning the wafer. The first alignment mark group is located entirely within the area between the first die and the second die. The first alignment mark group includes: (1) a first plurality of alignment lines formed in a first layer, and each line of the first plurality of alignment lines is formed using a first plurality of segments separated from each other by a first plurality of gaps filled with an insulating material, and (2) a second plurality of alignment lines formed in a second layer, the second layer being below the first layer, and each line of the second plurality of alignment lines is formed using a second plurality of segments separated from each other by a second plurality of gaps filled with an insulating material. In another form there is provided at least a second alignment mark group used for aligning the wafer to a tool used for patterning the wafer. The second alignment mark group is located entirely within the area between first die and the second die. The second alignment mark group includes (1) a third plurality of alignment lines formed in the first layer, and each line of the third plurality of alignment lines is formed using a third plurality of segments separated from each other by a third plurality of gaps filled with an insulating material, and (2) a fourth plurality of alignment lines formed in the second layer, the second layer being below the first layer, and each line of the fourth plurality of alignment lines being formed using a fourth plurality of segments separated from each other by a fourth plurality of gaps filled with an insulating material. In another form there is provided a third alignment mark group used for aligning the wafer to a tool used for patterning the wafer. The third alignment mark group is located entirely within the area between first die and the second die. The third alignment mark group includes (1) a fifth plurality of alignment lines formed in the first layer, and each line of the fifth plurality of alignment lines is formed using a fifth plurality of segments separated from each other by a fifth plurality of gaps filled with an insulating material, and (2) a sixth plurality of alignment lines formed in the second layer, the second layer is below the first layer, and each line of the sixth plurality of alignment lines is formed using a sixth plurality of segments separated from each other by a sixth plurality of gaps filled with an insulating material. In another form the wafer has at least a fourth alignment mark group used for aligning the wafer to the tool used for patterning the wafer. The fourth alignment mark group is located entirely within the area between first die and the second die. The fourth alignment mark group includes (1) a seventh plurality of alignment lines formed in the first layer, and each line of the seventh plurality of alignment lines is formed using a seventh plurality of segments separated from each other by a seventh plurality of gaps filled with an insulating material, and (2) an eighth plurality of alignment lines formed in the second layer, wherein the second layer is below the first layer, and each line of the eighth plurality of alignment lines is formed using an eighth plurality of segments separated from each other by an eighth plurality of gaps filled with an insulating material. In yet another form a central axis that is parallel to the first plurality of alignment lines of the first alignment mark group and a central axis that is parallel to the fifth plurality of lines of the third alignment mark group are separated by a first distance. A central axis that is parallel to the third plurality of alignment lines of the second alignment mark group and a central axis that is parallel to the seventh plurality of alignment lines of the fourth alignment mark group are separated by a second distance, and the second distance is greater than the first distance. In yet another form the first plurality of alignment lines, the third plurality of alignment lines, the fifth plurality of alignment lines, and the seventh plurality of alignment lines are formed in the first layer and the second plurality of alignment lines, the fourth plurality of alignment lines, the sixth plurality of alignment lines, and the eighth plurality of alignment lines formed in the second layer are formed such as they do not overlap. In yet another form a length of each of the first plurality of segments is at least three times greater than a length of each of the first plurality of gaps filled with the insulating material and a length of each of the second plurality of segments is at least three times greater than a length of each of the second plurality of gaps filled with the insulating material. In yet another form the first plurality of segments, the second plurality of segments, the third plurality of segments, the fourth plurality of segments, the fifth plurality of segments, the sixth plurality of segments, the seventh plurality of segments, and the eighth plurality of segments are formed using a conductive material containing at least copper.

Although the invention has been described with respect to specific conductivity types or polarity of potentials, skilled artisans appreciated that terms such as "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the alignment marks may be implemented with various materials which may be conductive or non-conductive. When conductive materials are used, other materials besides metals may be used. When conductive metals are used, other metals besides copper may be used. Any of a number of electrically insulating materials may be used to implement the described dielectrics. When metal is used to implement the alignment marks, in one form the alignment marks have no continuous metal in a direction that is orthogonal with the kerf line having a length that is greater than a predetermined percentage of the width of the kerf line. While the predetermined percentage can vary, in one form the predetermined percentage is fifty percent. In other forms the predetermined percentage is greater than one hundred percent. Various alignment patterns of the segments may be implemented wherein the gaps may partially align or not align at all. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A semiconductor wafer comprising:
   at least a first die;
   at least a second die, wherein the first die and the second die are separated from each other by an area located between the first die and the second die; and
   a first alignment mark group used for aligning the wafer to a tool used for patterning the wafer, the first alignment mark group located entirely within the area between the first die and the second die, wherein the first alignment mark group includes a first plurality of alignment lines and wherein each line of the first plurality of alignment lines is formed using a first plurality of discontinuous segments separated from each other by a first plurality of gaps filled with an insulating material;
   a second alignment mark group used for aligning the wafer to a tool used for patterning the wafer, the second alignment mark group located entirely within the area between first die and the second die, wherein the second alignment mark group includes a second plurality of alignment lines, and wherein each line of the second plurality of alignment lines is formed using a second plurality of discontinuous segments separated from each other by a second plurality of gaps filled with an insulating material; and
   a reference mark positioned between the first alignment mark group and the second alignment mark group that functions as a nominal alignment center.

2. The semiconductor wafer of claim 1, wherein the first plurality of discontinuous segments are formed either in a first plurality of metal layers of the wafer or in a first plurality of via layers of the wafer and the second plurality of discontinuous segments are formed either in a second plurality of metal layers of the wafer or in a second plurality of via layers of the wafer.

3. The semiconductor wafer of claim 1, wherein a length of each of the first plurality of discontinuous segments is at least three times greater than a length of each of the first plurality of gaps filled with the insulating material.

4. The semiconductor wafer of claim 1 further comprising at least a third alignment mark group used for aligning the wafer to a tool used for patterning the wafer, the third alignment mark group located entirely within the area between the first die and the second die, wherein the third alignment mark group includes a third plurality of alignment lines, and wherein each line of the third plurality of alignment lines is formed using a third plurality of discontinuous segments separated from each other by a third plurality of gaps filled with an insulating material.

5. The semiconductor wafer of claim 4 further comprising at least a fourth alignment mark group used for aligning the wafer to the tool used for patterning the wafer, the fourth alignment mark group located entirely within the area between first die and the second die, wherein the fourth alignment mark group includes a fourth plurality of alignment lines, and wherein each line of the fourth plurality of alignment lines is formed using a fourth plurality of discontinuous segments separated from each other by a fourth plurality of gaps filled with an insulating material.

6. The semiconductor wafer of claim 1, wherein the area between the first die and second die is for cutting in a direction orthogonal to the first plurality of alignment lines.

7. The semiconductor wafer of claim 1, wherein the first plurality of discontinuous segments are formed using a conductive material comprising at least copper.

8. A semiconductor wafer comprising:
   at least a first die;
   at least a second die, wherein the first die and the second die are separated from each other by an area located between the first die and the second die; and
   a first alignment mark for aligning the wafer to a tool used for patterning the wafer, the first alignment mark located entirely within the area between the first die and the second die, wherein the first alignment mark includes a central reference mark and a first alignment line and a second alignment line located on opposite sides of the central reference mark, and wherein the first alignment line is formed using a first plurality of discontinuous segments separated from each other by a first plurality of gaps filled with an insulating material and the second alignment line is formed using a second plurality of discontinuous segments separated from each other by a second plurality of gaps filled with the insulating material, wherein the central reference mark functions as a nominal alignment center.

9. The semiconductor wafer of claim 8, wherein the first plurality of discontinuous segments are formed either in a first plurality of metal layers of the wafer or in a first plurality of via layers of the wafer and the second plurality of discontinuous segments are either formed in a second plurality of metal layers of the wafer or in a second plurality of via layers of the wafer.

10. The semiconductor wafer of claim 8, wherein a length of each of the first plurality of discontinuous segments is at least three times greater than a length of each of the first plurality of gaps filled with the insulating material and wherein a length of each of the second plurality of discontinuous segments is at least three times greater than a length of each of the second plurality of gaps filled with the insulating material.

11. The semiconductor wafer of claim 8, wherein the first plurality of discontinuous segments are formed using a conductive material comprising at least copper.

12. A semiconductor wafer comprising:
   at least a first die;
   at least a second die, wherein the first die and the second die are separated from each other by an area located between the first die and the second die; and
   a first alignment mark group used for aligning the wafer to a tool used for patterning the wafer, the first alignment mark group located entirely within the area between the first die and the second die, wherein the first alignment mark group includes: (1) a first plurality of alignment lines formed in a first layer, and wherein each line of the first plurality of alignment lines is formed using a first plurality of discontinuous segments separated from each other by a first plurality of gaps filled with an insulating material, and (2) a second plurality of alignment lines formed in a second layer, wherein the second layer is below the first layer, and wherein each line of the second plurality of alignment lines is formed using a second plurality of discontinuous segments separated from each other by a second plurality of gaps filled with an insulating material;
   a second alignment mark group used for aligning the wafer to a tool used for patterning the wafer, the second alignment mark group located entirely within the area between first die and the second die, wherein the second alignment mark group includes (1) a third plurality of alignment lines formed in the first layer, and wherein each line of the third plurality of alignment lines is formed using a third plurality of discontinuous segments separated from each other by a third plurality of gaps filled with an insulating material, and (2) a fourth plurality of alignment lines formed in the second layer, wherein the second layer is below the first layer, and wherein each line of the fourth plurality of alignment lines is formed using a fourth plurality of discontinuous segments separated from each other by a fourth plurality of gaps filled with an insulating material; and a reference mark positioned between the first alignment mark group and the second alignment mark group that functions as a nominal alignment center.

13. The semiconductor wafer of claim 12 further comprising at least a third alignment mark group used for aligning the wafer to a tool used for patterning the wafer, the third alignment mark group located entirely within the area between first die and the second die, wherein the third alignment mark group includes (1) a fifth plurality of alignment lines formed in the first layer, and wherein each line of the fifth plurality of alignment lines is formed using a fifth plurality of discontinuous segments separated from each other by a fifth plurality of gaps filled with an insulating material, and (2) a sixth plurality of alignment lines formed in the second layer, wherein the second layer is below the first layer, and wherein each line of the sixth plurality of alignment lines is formed using a sixth plurality of discontinuous segments separated from each other by a sixth plurality of gaps filled with an insulating material.

14. The semiconductor wafer of claim 13 further comprising at least a fourth alignment mark group used for aligning the wafer to the tool used for patterning the wafer, the fourth alignment mark group located entirely within the area between first die and the second die, wherein the fourth alignment mark group includes (1) a seventh plurality of alignment lines formed in the first layer, and wherein each line of the seventh plurality of alignment lines is formed using a seventh plurality of discontinuous segments separated from each other by a seventh plurality of gaps filled with an insulating material, and (2) an eighth plurality of alignment lines formed in the second layer, wherein the second layer is below the first layer, and wherein each line of the eighth plurality of alignment lines is formed using an eighth plurality of discontinuous segments separated from each other by an eighth plurality of gaps filled with an insulating material.

15. The semiconductor wafer of claim 12, wherein the area between the first die and second die is for cutting in a direction orthogonal to the first plurality of alignment lines.

16. The semiconductor wafer of claim 14, wherein the first plurality of alignment lines, the third plurality of alignment lines, the fifth plurality of alignment lines, and the seventh plurality of alignment lines are formed in the first layer and the second plurality of alignment lines, the fourth plurality of alignment lines, the sixth plurality of alignment lines, and the eighth plurality of alignment lines formed in the second layer are formed such as they do not overlap.

17. The semiconductor wafer of claim 12, wherein a length of each of the first plurality of discontinuous segments is at least three times greater than a length of each of the first plurality of gaps filled with the insulating material and wherein a length of each of the second plurality of discontinuous segments is at least three times greater than a length of each of the second plurality of gaps filled with the insulating material.

18. The semiconductor wafer of claim 17, wherein the first plurality of discontinuous segments, the second plurality of discontinuous segments, the third plurality of discontinuous segments, the fourth plurality of discontinuous segments, the fifth plurality of discontinuous segments, the sixth plurality of discontinuous segments, the seventh plurality of discontinuous segments, and the eighth plurality of discontinuous segments are formed using a conductive material comprising at least copper.

* * * * *